United States Patent
Rodriguez et al.

(10) Patent No.: US 9,171,645 B2
(45) Date of Patent: Oct. 27, 2015

(54) ADDRESS WINDOWING FOR AT-SPEED BITMAPPING WITH MEMORY BUILT-IN SELF-TEST

(71) Applicant: INTERNATIONAL BUSINESS MACHINES CORPORATION, Armonk, NY (US)

(72) Inventors: Geovanny Rodriguez, Alburgh, VT (US); Brian J. Vincent, Essex Junction, VT (US); Timothy J. Vonreyn, Williston, VT (US)

(73) Assignee: GLOBALFOUNDRIES U.S. 2 LLC, Hopewell Junction, NY (US)

( * ) Notice: Subject to any disclaimer, the term of this patent is extended or adjusted under 35 U.S.C. 154(b) by 198 days.

(21) Appl. No.: 13/903,434

(22) Filed: May 28, 2013

(65) Prior Publication Data
US 2014/0359383 A1    Dec. 4, 2014

(51) Int. Cl.
G01R 31/28 (2006.01)
G11C 29/44 (2006.01)
G11C 29/30 (2006.01)

(52) U.S. Cl.
CPC ............ G11C 29/44 (2013.01); G11C 29/30 (2013.01); G11C 2029/4402 (2013.01)

(58) Field of Classification Search
CPC ... G01R 31/31724; G11C 29/12; G11C 29/18
USPC .................. 714/733–734, 736, 742–743
See application file for complete search history.

(56) References Cited

U.S. PATENT DOCUMENTS

| | | | | |
|---|---|---|---|---|
| 5,495,454 A | * | 2/1996 | Fukuzo | 365/230.08 |
| 6,438,044 B2 | * | 8/2002 | Fukuda | 365/200 |
| 2003/0167428 A1 | * | 9/2003 | Gold | 714/720 |
| 2004/0237009 A1 | * | 11/2004 | Tester | 714/710 |
| 2010/0223511 A1 | | 9/2010 | Seuring et al. | |

* cited by examiner

*Primary Examiner* — Shelly A Chase
(74) *Attorney, Agent, or Firm* — Andrew M. Calderson; Roberts Mlotkowski Safran & Cole, P.C.

(57) ABSTRACT

Integrated circuits with memory built-in self-test (BIST) logic and methods of testing using the same are disclosed. The method includes setting an address window for locating defects in a memory array. The method further includes comparing output data of the memory array to expected data to determine that a defect exists at location "M" in the memory array within the address window. The method further includes storing, in registers, the address M and a resultant bit fail vector associated with the location "M" of the defect found in the memory array. The method further includes resetting the registers to a null value and resetting the address window with a new minimum and maximum address pair, to compare the output data of the memory array to the expected data within the reset address window which excludes address M.

20 Claims, 3 Drawing Sheets

ADDRESS WINDOWING FOR AT-SPEED BITMAPPING WITH MEMORY BUILT-IN SELF-TEST

FIELD OF THE INVENTION

The invention relates to integrated circuits and, more particularly, to integrated circuits with memory built-in self-test (BIST) logic and testing of the same.

BACKGROUND

The testing of semiconductor devices represents a part of the manufacturing process. Testing can uncover design defects and, importantly, manufacturing defects that result in process variability. For example, manufacturing defects due to process variability are such defects that do not correspond with the verified circuit design owing to process fluctuation in one or more process steps. These defects can be identified in, for example, one or more logic blocks or one or more embedded memory arrays. It is important to identify such defects prior to shipment and assembly or integration into larger components, in order to mitigate any downstream costs of repair and/or replacement. That is, the costs caused by a defective circuit board including a faulty chip are typically significantly higher than identifying a defective chip prior to shipping and assembling of the circuit board.

On-chip memory defects can be sensitive to operating frequency. As the on-chip memory operating frequencies are greater than provided by a stand-alone tester, a common method to detect such failures is to test the memory with on-board test circuitry that operates at the higher frequencies (e.g., memory built in self test or BIST). To record all failures associated with the memory, though, requires a large amount of storage space on-board.

Accordingly, there exists a need in the art to overcome the deficiencies and limitations described hereinabove.

SUMMARY

In an aspect of the invention, a method comprises setting an address window for locating defects in a memory array. The method further comprises comparing output data of the memory array to expected data to determine that a defect exists at address "M" in the memory array within the address window. The method further comprises storing, in registers, the address M and a resultant bit fail vector associated with the address "M" of the defect found in the memory array. The method further comprises resetting the registers to a null value and resetting the address window with a new minimum and maximum address pair, to compare the output data of the memory array to the expected data within the reset address window which excludes address M.

In an aspect of the invention, a method comprises comparing output data of a memory array to expected data to determine that a defect exists at location "M" in the memory array within an address window. The method further comprises cycling null values in a register until the defect is found within the address window. The method further comprises storing, in a register, a resultant bit fail vector associated with the location "M" of the defect found in the memory array. The method further comprises reading out of the register and, thereafter, resetting the register to the null value. The method further comprises resetting the address window with a new minimum and maximum address pair. The method further comprises repeating the steps of claim 1 until output data of an entire address space 0 to N for the memory array has been compared to the expected data.

In an additional aspect of the invention, a system comprises: a minimum address register and a maximum address register, which sets minimum and maximum addresses for an address window; a built in system test (BIST) engine, which: receives the minimum and maximum addresses for an address window from the minimum address register and the maximum address register; and asserts an enable signal for the address window; an expected data register which received data from the BIST engine; a comparator, which: compares data output from the expected data register and a memory array; outputs a logic "0" when no defect is found in the memory array; and outputs a logic "1" when the defect is found in the memory array; a bit fail vector register, which: cycles through the logic "0" until the defect is found within the address window; and freezes with the logic "1"(s) to identify resultant failing bit locations in an output data word from the memory array within the address window; an address register which freezes to store a failing address of the memory array; and logic which receives the logic "1"(s) and the enable signal, the logic includes a fail register which propagate a signal to hold the logic "1"(s) in the bit fail vector register and the failing address in the address register and to reset the bit fail vector register for cycling through the logic "0" and reset the address register to store the address of a next failing address.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the structures of the present invention. In still further embodiments, a method in a computer-aided design system is provided for generating a functional design model of the structures of the present invention. The method comprises generating a functional representation of the structural elements of the structures of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits and, more particularly, to integrated circuits with memory built-in self-test (BIST) logic and testing of the same. More specifically, the present invention is directed to an address windowing feature of a BIST logic, which comprises specifying a minimum and maximum address, where bitmap information for a first failure within this address space is recorded. In more specific embodiments, the present invention provides a specification of a minimum and maximum address window in which the first failing address information (i.e., bitmap) for the window is captured while operating the on-board memory at application frequencies. Based on the captured fail information, the address window can be adjusted and the test re-run to capture the fail information for the next failing address. The process is repeated until fail information for all failing addresses are captured.

Advantageously, the present invention provides a methodical way to capture the bitmap fail information for all addresses within a memory array by adjusting the window minimum and maximum addresses after a fail is found, without the need for large on chip memory storage. For example, if the entire address space for the memory is 0 to N and the window is first set to min address=0, max address=N, after a fail at address M (0<=M<=N) is captured the window can be adjusted to min address=M+1 to capture the next fail, and so on. The registers capturing this fail address can then be reset, thereby reducing the amount of on-board storage space required to record all failures associated with the memory, compared to conventional configurations and processes. Also, advantageously, the systems and processes of the present invention can test the memory array at operating frequencies, in order to detect speed sensitive defects. In this way, it is possible to fine tune manufacturing processing to correct for such defects.

Figure 1:
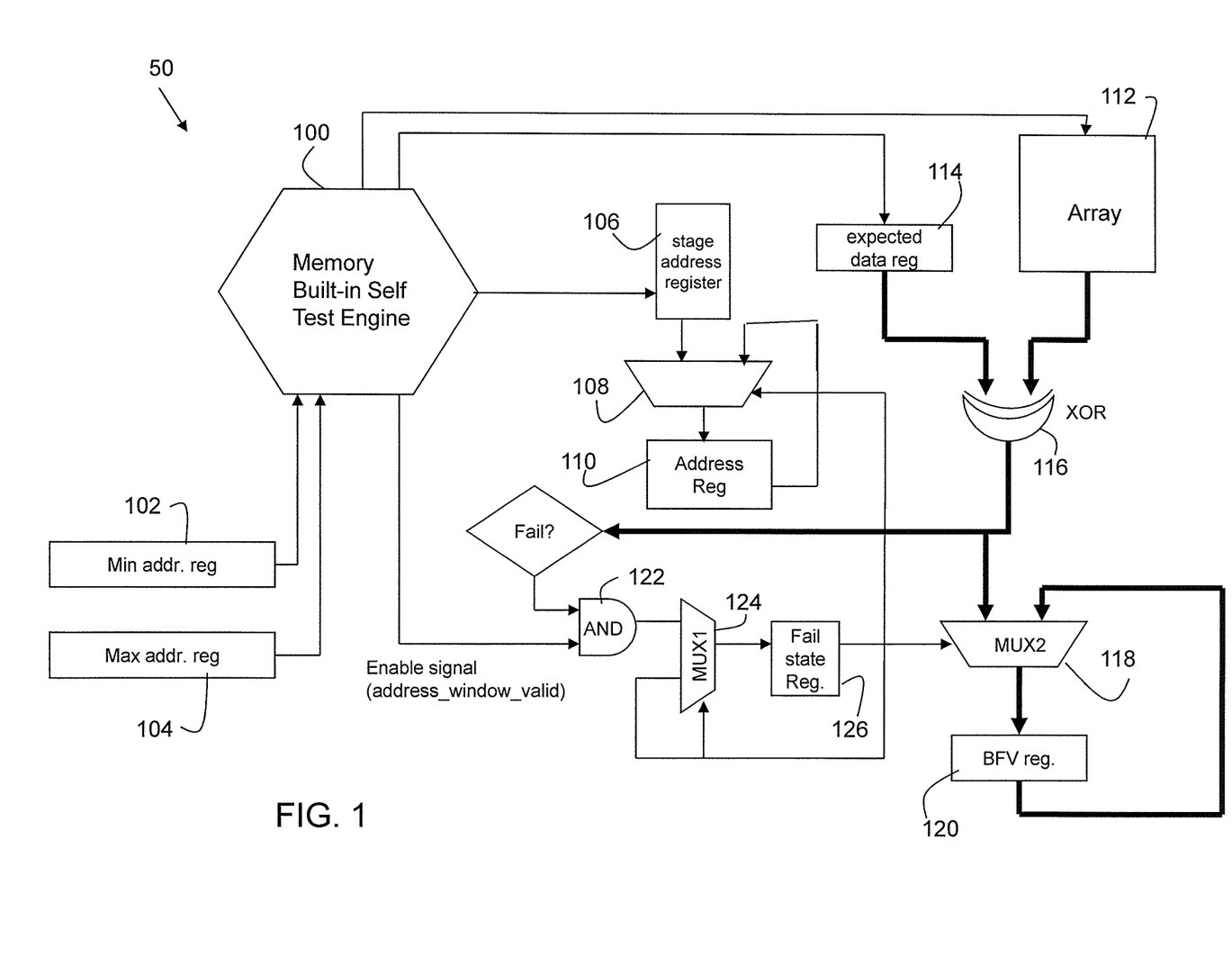
FIG. 1 shows a schematic of circuit with a built in self test (BIST) engine and related components, embedded within a chip in accordance with aspects of the present invention.

FIG. 1 shows a schematic of a circuit with a built in self test (BIST) engine and related components, embedded within a chip in accordance with aspects of the present invention. In embodiments, the circuit 50 includes a BIST engine 100 and related components which are responsible for providing stimulus test patterns (e.g., address, data, and read/write commands) to an "array" under test, and determining whether the array under test has defects. The defects may be, for example, any relevant failure type of the memory array, such as "stuck-at," "stuck-open," coupling of memory cells, etc. Advantageously, in embodiments, the built-in test may be operated at regular operating speed of the semiconductor device to detect speed sensitive defects in the memory array.

Still referring to FIG. 1, in accordance with aspects of the present invention, the BIST engine 100 will initially receive address information from a minimum address register 102, e.g., initially set at 0, and a maximum address register 104, e.g., initially set at N, where N is the maximum address of the memory array 112. This address information can be used, for example, to provide an enable signal (e.g., address_window_valid) for an address window, in accordance with further processes described below. In embodiments, the minimum address register 102 will be reset each time a fail is found, e.g., if a fail is found at address M (0<=M<=N), the minimum address register 102 will be reset to M+1 and so on. For example, the address window is initially set to min address=0 and max address=N and the new minimum address is set to M+1 for a case of tests with incrementing addressing. On the other hand, new maximum address is set to M−1 for a case of tests with decrementing addressing.

In operation, the BIST engine 100 will generate address values between 0 and N, and provide the address values to the array and an address register 106. In turn, the address register 106 will record the address values. In embodiments, the address values will be looped through a MUX 108, e.g., MUX3, and address register 110, until a fail event (e.g., defect in the memory array 112) is detected, at which time the register 110 will record an address of the fail as described further herein. After a fail event is detected, the address register can be reset. The BIST engine 100 will also generate the enable signal for the address window.

In accordance with aspects of the present invention, the BIST engine 100 will write input test data to the memory array 112 and to an expected data register 114. As should be understood by those of ordinary skill in the art, the input test data written to the expected data register 114 is used to compare against the output data of the memory array 112, to determine whether any defects exist in the memory array 112. More specifically, on an array read operation, the data in the expected data register 114 is compared with the output of the memory array 112 via an XOR gate (comparator) 116 to determine whether there are any defects in the memory array 112. The results of the XOR gate 116 can then be fed into the MUX 118, e.g., MUX2 and BFV register 120 and also the AND gate 122.

By way of more specific example, on an array read operation, the XOR gate 116 will provide a corresponding value at its output signifying whether a defect has been found in the memory array 112. For instance, the value of the output may show logic "0" when no error occurs in writing data into the memory and reading back the data; whereas, the output may include logic "1"(s) when a mismatch is found between the actually read data and the expected data (e.g., data bits). Accordingly, after the read of the memory array 112 is completed, e.g., for each 32 or 64 bit word, a corresponding value may be presented at the output of the XOR gate 116, e.g., the output may be switched from logic "0" to a value containing logic "1"(s).

In embodiments, the logic "0" can be fed into the MUX 118, e.g., MUX2, and BFV register 120, and looped around until a value containing one or many logic "1"(s) is output by the XOR gate 116, at which time the BFV register 120 will "freeze" with the value containing one or many logic "1"(s), e.g., the BFV register 120 will store the failing bit vector. That is, upon receiving a value containing one or many logic "1"(s), the BFV register 120 will store the resultant bit fail vector, where a b'1 in bit position N of the vector indicates a miscompare of data output N from the array with the expected output from the array. This recorded data, in turn, is used to identify the location of the failing bit and the address line of the memory array 112.

In embodiments, the BFV register 120 can record, e.g., freeze, with a value containing one or many logic "1"(s) and the address register 110 can store the address information, e.g., freeze, by implementing the following sequence of events. First, the "Fail" block will examine all bits from the XOR gate to determine if one or more logic "1" (s) are present indicating a fail or miscompare has occurred. If address windowing is enabled, e.g., "address_window_valid" signal asserted by the BIST engine 100 is within the range specified by the minimum address register 102 and maximum address register 104 for the address applied to the memory array 112, and a miscompare occurred, e.g., logic "1", the AND gate 122 will propagate a true signal to MUX 124, e.g., MUX1. The selector to MUX 124 is then switched on in a subsequent cycle and a fail state register 126 (e.g., sticky register) will set and hold until reset. In this way, the output of the fail state register 126 will switch the selector on MUX 118 to hold the current value, e.g., containing one or many logic "1"(s) of the BFV register 120, e.g., to hold the bitmap or failing information from the previous compare cycle. Similarly, the output of the fail state register 126 will switch the selector on MUX 108 to hold the current value of the address register 110. In embodiments, the address information of the failed portion of the memory array can be provided to output pins for further analysis.

After a fail address has been identified and captured (recorded), e.g., address M (0<=M<=N), the registers 110 and 120 and 126 can be cleared (reset), e.g., reset to logic "0" (null value), for the above processes to continue. Also, the minimum address register 102 can be reset, e.g., the minimum address register 102 can be reset to min address=M+1, and a new enable signal, e.g., address_window_valid, can be used to enable the AND gate 122. In this way, the system and processes of the present invention can capture the next fail and so on, within an updated address window and a cleared registered. Accordingly, there is no need to have large memory space on the chip in order to record all failures associated with the memory. Instead, as each register is reset after each fail and the address window is incremented, only two registers are required: an address register and a bit fail vector (BFV) register.

System Environment

As will be appreciated by one skilled in the art, aspects of the present invention may also be implemented off chip, as be embodied as a system, method or computer program product. Accordingly, aspects of the present invention may be embodied within hardware, software (including firmware, resident software, micro-code, etc.) or by combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized in implementing aspects of the present invention. The computer readable medium may be a computer readable signal medium or a computer readable storage medium and/or device. A computer readable storage medium and/or device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium and/or device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium and/or device may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 2:
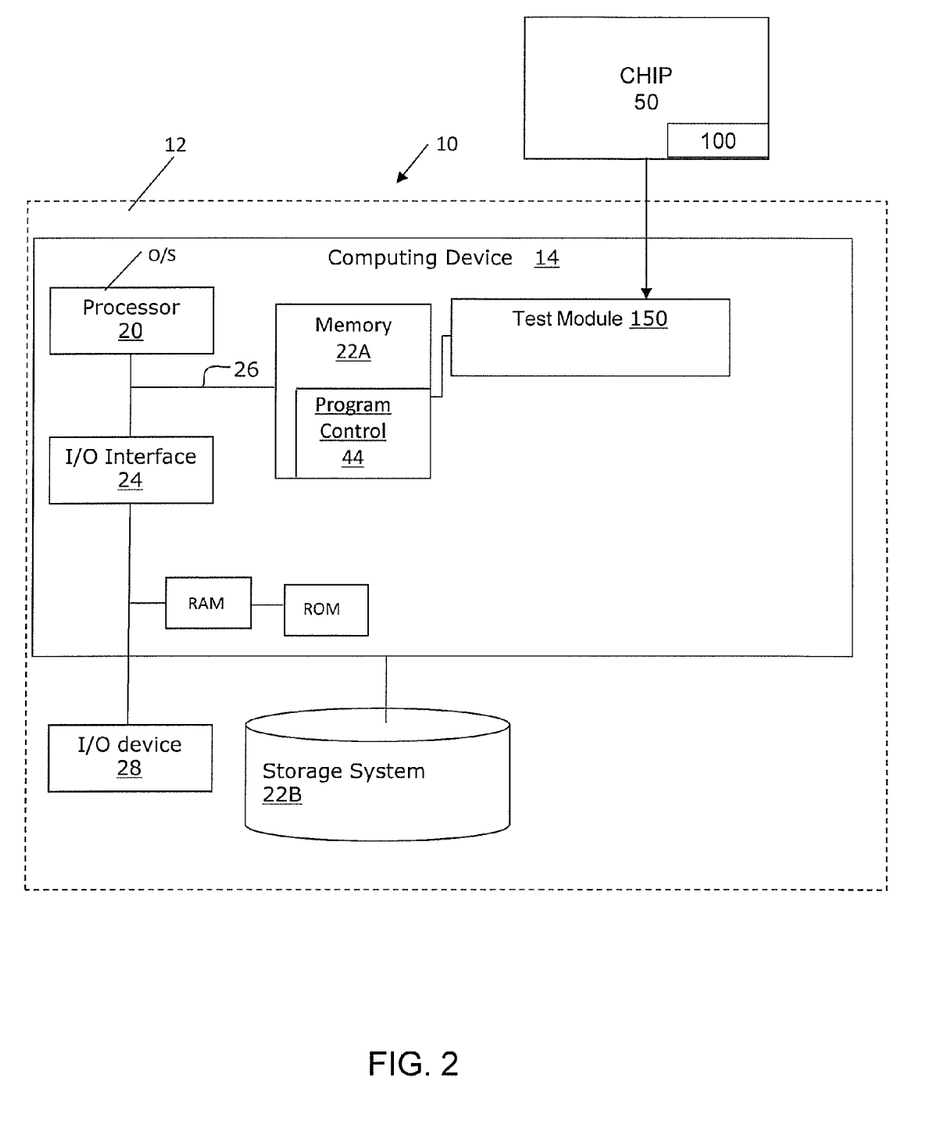
FIG. 2 is a system environment for implementing processes in accordance with aspects of the present invention.

FIG. 2 shows an illustrative environment 10 for managing the processes in accordance with the invention. To this extent, environment 10 includes a server or other computing system 12 that can perform the processes described herein. In particular, server 12 includes a computing device 14. The computing device 14 can be resident on a network infrastructure or computing device of a third party service provider (any of which is generally represented in FIG. 2).

The computing device 14 also includes a processor 20, memory 22A, an I/O interface 24, and a bus 26. The memory 22A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 14 is in communication with external I/O device/resource 28 and storage system 22B. For example, I/O device 28 can comprise any device that enables an individual to interact with computing device 14 (e.g., user interface) or any device that enables computing device 14 to communicate with one or more other computing devices using any type of communications link. The external I/O device/resource 28 may be for example, a handheld device, PDA, handset, keyboard, etc.

In general, processor 20 executes computer program code (e.g., program control 44), which can be stored in memory 22A and/or storage system 22B. Moreover, in accordance with aspects of the invention, program control 44 controls a control and compare module 150, e.g., the processes described herein. The control and compare module 150 can be implemented as one or more program code in program control 44 stored in memory 22A as separate or combined modules. Additionally, the control and compare module 150 may be implemented as separate dedicated processors or a single or several processors to provide the function of these tools. While executing the computer program code, the processor 20 can read and/or write data to/from memory 22A, storage system 22B, and/or I/O interface 24. The program code executes the processes of the invention. The bus 26 provides a communications link between each of the components in computing device 14.

In embodiments, control and compare module 150 can receive information from the circuit 50 and, more particularly, output from the memory array 112 and BIST engine 100 in order to provide the processes of the present invention. Specifically, the BIST engine 100 initially receives address information from the control and compare module 150 (or registers), which can be reset with min and max addresses after a fail event is detected, in accordance with aspects of the present invention. In operation, the BIST engine 100 will write input test data to the memory array 112 and provide this information to the control and compare module 150. On an array read operation, the data provided to the control and compare module 150 is compared with the output of the memory array 112 via the control and compare module 150 or, alternatively, the XOR gate 116, to determine whether there are any defects in the memory array 112. The results can then be used to determine whether a defect has been found in the memory array 112.

For example, the value of the output of the XOR gate 116 may show logic "0" when no error occurs in writing data into the memory and reading back the data; whereas, the output may contain one or many logic "1"(s) when a mismatch is found between the actually read data and the expected data. Accordingly, after the test of the memory array 112 is completed, e.g., for each 32 or 64 bit word, a corresponding signal may be presented at the output of the XOR gate 116 or the control and compare module 150 to determine an address of the defect. After a fail address has been identified and captured (recorded), e.g., address M (0<=M<=N), the minimum address register can be reset, e.g., reset to min address=M+1, and a new enable signal, e.g., address_window_valid can be used to restart the processes.

The computing device 14 can comprise any general purpose computing article of manufacture capable of executing computer program code installed thereon (e.g., a personal computer, server, etc.). However, it is understood that computing device 14 is only representative of various possible equivalent-computing devices that may perform the processes described herein. To this extent, in embodiments, the functionality provided by computing device 14 can be implemented by a computing article of manufacture that includes any combination of general and/or specific purpose hardware and/or computer program code. In each embodiment, the program code and hardware can be created using standard programming and engineering techniques, respectively.

Similarly, computing infrastructure 12 is only illustrative of various types of computer infrastructures for implementing the invention. For example, in embodiments, server 12 comprises two or more computing devices (e.g., a server cluster) that communicate over any type of communications link, such as a network, a shared memory, or the like, to perform the process described herein. Further, while performing the processes described herein, one or more computing devices on server 12 can communicate with one or more other computing devices external to server 12 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Flow Diagram

Figure 3:
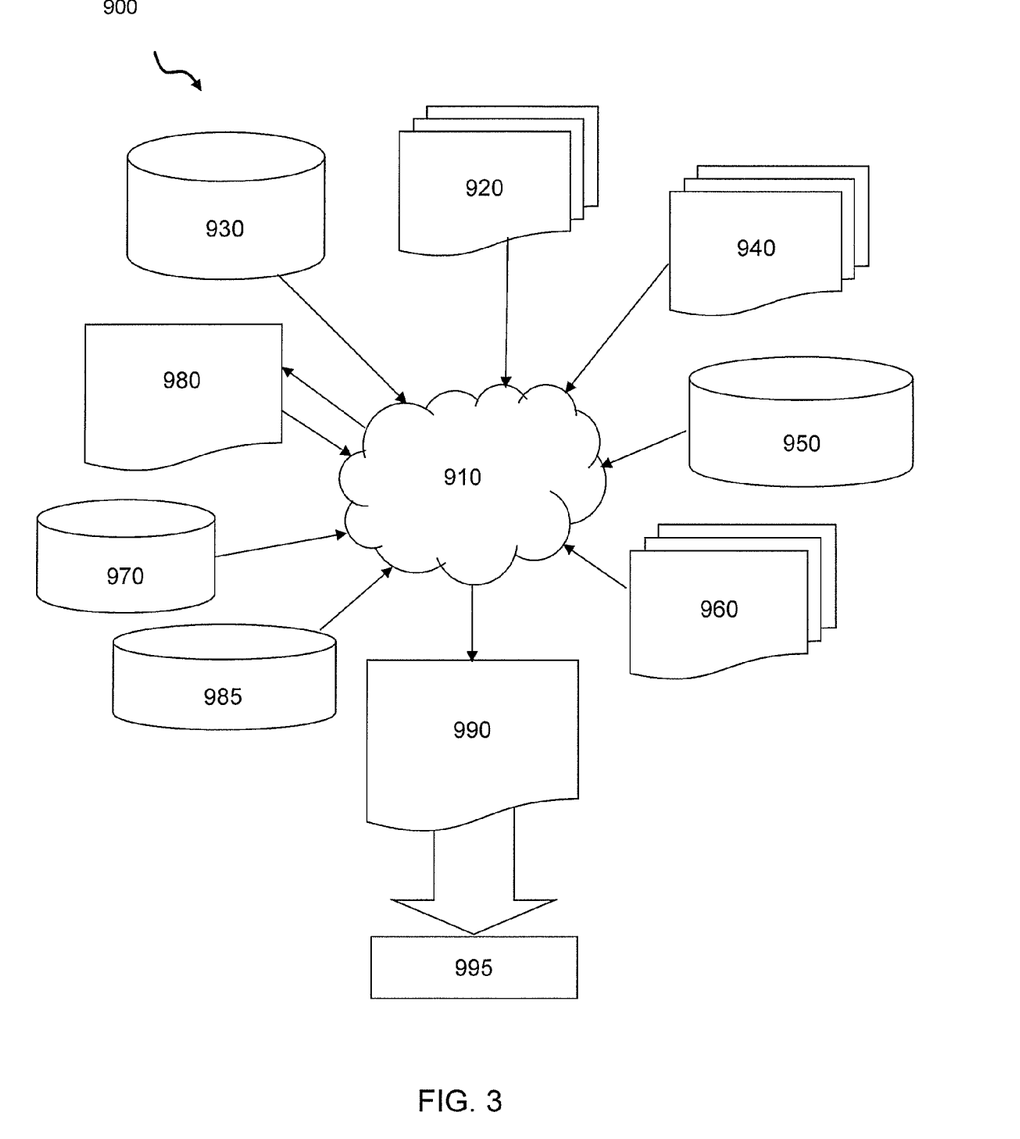
FIG. 3 is a flow diagram of a design process used in semiconductor design, manufacture, and/or test.

FIG. 3 is a flow diagram of a design process used in semiconductor design, manufacture, and/or test. FIG. 3 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Thus, the design structures can be provided in a computer program product comprising a computer readable storage medium having stored/encoded thereon. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 3 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention. In one embodiment, design structure 990 may comprise a compiled, executable HDL simulation model that functionally simulates the devices.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
    setting an address window for locating defects in a memory array;
    comparing output data of the memory array to expected data to determine that a defect exists at address "M" in the memory array within the address window;
    storing, in registers, the address M and a resultant bit fail vector associated with the address "M" of the defect found in the memory array; and
    resetting the registers to a null value and resetting the address window with a new minimum and maximum address pair, to compare the output data of the memory array to the expected data within the reset address window which excludes address M.

2. The method of claim 1, further comprising:
    on a subsequent array read operation, comparing output data of the memory array to the expected data to determine that a defect exists at address "$M_1$" in the memory array within the reset address window;
    storing, in the register, resultant bit fail vector associated with the address "$M_1$" of the defect found in the memory array;
    resetting a register, of the registers, to a null value; and
    resetting the address window with a new address minimum/maximum combination to exclude a fail at the address M and the address $M_1$ and include potential other unique failing addresses to subsequently compare the output data of the memory array to expected data within the reset address window with the new address minimum/maximum combination.

3. The method of claim 2, further comprising reading out of the register the resultant bit fail vector to determine a bit location of the defect and reading out an address register to determine the address location of the defect, prior to the resetting of the register to the null value.

4. The method of claim 1, further comprising:
outputting from a comparator a logic "0" when no defect is found;
outputting from the comparator a logic "1" bit when a mismatch is found between the corresponding output data bit of the memory array and the expected data bit; and
when the logic is "1"(s), freezing the register with the logic "1"(s) to record the resultant bit fail vector within the memory array within the address window.

5. The method of claim 4, wherein the comparator is an XOR gate.

6. The method of claim 4, wherein the comparator is an off chip computing system.

7. The method of claim 4, wherein the freezing of the register comprises:
examining all bits from the comparator to determine if the mismatch has occurred;
asserting an enable signal for the address window, which ensures that an address is within a range specified by a minimum address register and maximum address register for the memory array;
upon finding the mismatch and the assertion of the enable signal, propagating a signal to a fail register, which will propagate a signal to hold the logic "1" in the register.

8. The method of claim 7, wherein the fail register will set and hold, and propagate a true signal to a MUX such that a selector of the MUX will be switched to hold the logic "1" in the register.

9. The method of claim 1, wherein after a fail address has been identified and captured, the register is cleared and the steps of claim 1 are repeated for the reset address window.

10. The method of claim 1, wherein an entire address space for the memory array is 0 to N and the address window is set to min address=0 and max address=N.

11. The method of claim 10, wherein an address space for the memory array is reset to exclude the address M, when the defect is found at the address M.

12. The method of claim 1, wherein when no defect is found the register will loop through logic "0" for each address within the address window of the memory array.

13. The method of claim 1, wherein:
a built in system test (BIST) engine initially receives address information from a minimum address register and a maximum address register to set the address window;
the BIST engine asserts an enable signal upon a fail detection, enabling the register to store the address "M" of the defect in the memory array; and
the BIST engine is reset with minimum and maximum address combinations to exclude all previously stored failing addresses each time a defect is detected.

14. A method, comprising:
comparing output data bit of a memory array to expected data bit to determine that a defect exists at address "M" in the memory array within an address window;
cycling null values in a register until the defect is found within the address window;
storing, in a register, a resultant bit fail vector associated with the address "M" of the defect found in the memory array;
reading out of the register and, thereafter, resetting the register to the null value;
resetting the address window with a new minimum and maximum address pair; and
repeating the following steps until output data bits of an entire address space 0 to N for the memory array has been compared to the expected data bits:
setting the address window for locating defects in the memory array;
comparing output data of the memory array to expected data to determine that a defect exists at address "M" in the memory array within the address window;
storing, in the register, the address M and a resultant bit fail vector associated with the address "M" of the defect found in the memory array; and
resetting the registers to a null value and resetting the address window with the new minimum and maximum address pair, to compare the output data of the memory array to the expected data within the reset address window which excludes address M.

15. The method of claim 14, wherein the address window is set to min address=0 and max address=N and the new minimum address is set to M+1 for a case of tests with incrementing addressing.

16. The method of claim 14, wherein the address window is set to min address=0 and max address=N and the new maximum address is set to M−1 for a case of tests with decrementing addressing.

17. The method of claim 14, further comprising:
outputting from a comparator a logic "0" when no defect is found;
outputting from the comparator a logic "1" when a mismatch is found between the output data bit of the memory array and the expected data bit; and
when the logic is "1", freezing the register with the logic "1" to record the resultant bit fail vector within the memory array within the address window, wherein the freezing of the register comprises:
examining all bits from the comparator to determine if the mismatch has occurred;
asserting an enable signal for the address window, which ensures that an address is within a range specified by a minimum address register and maximum address register for the memory array; and
propagating a signal to a fail register, which will propagate a signal to hold the logic "1" in the register; and
an address enable signal and the detection of the defect initiates the storing.

18. The method of claim 17, wherein the comparator is an off chip computing system.

19. The method of claim 17, wherein:
a built in system test (BIST) engine initially receives address information from a minimum address register and a maximum address register to set the address window;
the BIST engine asserts the enable signal, enabling the register to store the location "M" of the defect in the memory array; and
the BIST engine is reset with the new minimum address and maximum address pair each time a fail is found.

20. A system, comprising:
a minimum address register and a maximum address register, which sets minimum and maximum addresses for an address window;

a built in system test (BIST) engine, which:
  receives the minimum and maximum addresses for an address window from the minimum address register and the maximum address register; and
  asserts an enable signal for the address window;
an expected data register which received data from the BIST engine;
a comparator, which:
  compares data output from the expected data register and a memory array;
  outputs a logic "0" when no defect is found in the memory array; and
  outputs a logic "1" when the defect is found in the memory array;
a bit fail vector register, which:
  cycles through the logic "0" until the defect is found within the address window; and
  freezes with the logic "1"(s) to identify resultant failing bit locations in an output data word from the memory array within the address window;
  an address register which freezes to store a failing address of the memory array; and
logic which receives the logic "1"(s) and the enable signal, the logic includes a fail register which propagate a signal to hold the logic "1"(s) in the bit fail vector register and the failing address in the address register and to reset the bit fail vector register for cycling through the logic "0" and reset the address register to store the address of a next failing address.

* * * * *